(12) United States Patent
Mendonsa et al.

(10) Patent No.: US 11,377,736 B2
(45) Date of Patent: Jul. 5, 2022

(54) ATOMIC LAYER DEPOSITION SYSTEMS, METHODS, AND DEVICES

(71) Applicant: Seagate Technology LLC, Cupertino, CA (US)

(72) Inventors: Riyan Alex Mendonsa, Edina, MN (US); Martin Giles Blaber, Minneapolis, MN (US); Brett R. Herdendorf, Mound, MN (US); Kevin A. Gomez, Eden Prairie, MN (US)

(73) Assignee: Seagate Technology LLC, Fremont, CA (US)

( * ) Notice: Subject to any disclaimer, the term of this patent is extended or adjusted under 35 U.S.C. 154(b) by 86 days.

(21) Appl. No.: 16/745,132

(22) Filed: Jan. 16, 2020

(65) Prior Publication Data
US 2020/0283895 A1 Sep. 10, 2020

Related U.S. Application Data

(60) Provisional application No. 62/815,858, filed on Mar. 8, 2019.

(51) Int. Cl.
| | | |
|---|---|---|
| *C23C 16/455* | (2006.01) | |
| *C23C 16/48* | (2006.01) | |
| *G11B 13/08* | (2006.01) | |
| *H01L 21/02* | (2006.01) | |
| *G11B 5/31* | (2006.01) | |
| *H01L 21/67* | (2006.01) | |
| *C23C 16/46* | (2006.01) | |

(52) U.S. Cl.
CPC ........ *C23C 16/45544* (2013.01); *C23C 16/46* (2013.01); *C23C 16/483* (2013.01); *G11B 5/3116* (2013.01); *G11B 5/3133* (2013.01); *G11B 13/08* (2013.01); *H01L 21/0228* (2013.01); *H01L 21/67109* (2013.01)

(58) Field of Classification Search
CPC .............. C23C 16/46; C23C 16/45591; C23C 16/45544
See application file for complete search history.

(56) References Cited

U.S. PATENT DOCUMENTS

| | | |
|---|---|---|
| 7,455,884 B2 | 11/2008 | Sandhu |
| 8,514,673 B1 | 8/2013 | Zhao et al. |
| 9,620,152 B2 | 4/2017 | Kautzky et al. |
| 9,842,613 B2 | 12/2017 | Cheng et al. |
| 10,217,482 B2 | 2/2019 | Sankar et al. |
| 2002/0066411 A1 | 6/2002 | Chiang et al. |

(Continued)

OTHER PUBLICATIONS

Richard W. Johnson et al. "A brief review of atomic layer deposition: from fundamentals to applications". Materials Today. vol. 17. No. 5. pp. 236-246. Jun. 2014.

(Continued)

*Primary Examiner* — Joseph A Miller, Jr.
(74) *Attorney, Agent, or Firm* — Faegre Drinker Biddle & Reath LLP

(57) ABSTRACT

A system includes a chamber, a support structure disposed in the chamber, and one or more heads. The support structure is configured to support and position a substrate. The one or more heads includes an energy source coupled to a near-field transducer for providing localized energy towards the support structure at select locations within the chamber.

20 Claims, 8 Drawing Sheets

(56) References Cited

U.S. PATENT DOCUMENTS

| | | | |
|---|---|---|---|
| 2003/0121608 A1* | 7/2003 | Chen | C23C 16/34 |
| | | | 257/E21.171 |
| 2005/0078462 A1 | 4/2005 | Dando et al. | |
| 2006/0288937 A1 | 12/2006 | Dando et al. | |
| 2010/0024732 A1 | 2/2010 | Mokhlesi et al. | |
| 2011/0005461 A1* | 1/2011 | Vandermeulen | H01J 37/08 |
| | | | 118/723 MA |
| 2011/0104395 A1* | 5/2011 | Kumagai | C23C 16/4401 |
| | | | 427/554 |
| 2013/0107390 A1* | 5/2013 | Huang | G11B 5/6088 |
| | | | 360/59 |
| 2013/0143415 A1 | 6/2013 | Yudovsky et al. | |
| 2013/0243971 A1 | 9/2013 | Thompson et al. | |
| 2014/0090981 A1 | 4/2014 | Paik et al. | |
| 2015/0275364 A1* | 10/2015 | Thompson | C23C 16/4584 |
| | | | 427/532 |
| 2016/0133277 A1* | 5/2016 | Cheng | G11B 9/12 |
| | | | 369/13.33 |
| 2018/0127877 A1 | 5/2018 | Shim et al. | |
| 2018/0216232 A1 | 8/2018 | Sundaram | |

OTHER PUBLICATIONS

English Translation and China National Intellectual Property Administration, Office Action dated Dec. 13, 2021 for Application No. 202010156627.1.

* cited by examiner

ATOMIC LAYER DEPOSITION SYSTEMS, METHODS, AND DEVICES

RELATED APPLICATIONS

This application claims priority to U.S. Provisional Application No. 62/815,858, filed Mar. 8, 2019, which is herein incorporated by reference in its entirety for all purposes.

BACKGROUND

Atomic layer deposition (ALD) is a type of thin-film deposition process based on sequential delivery of gaseous precursors for growing layers of materials onto a surface. ALD systems are known to create highly controllable and precise deposition thickness and deposition uniformity. However, the sequential process adapted by ALD systems have limited rates of deposition, leading to high costs and low throughput. Additionally, traditional ALD systems are designed to deposit layers of materials onto all depositable (e.g., functionalized) surfaces within the reaction chamber, which may require costly post-processing steps such as selective etching. Therefore, there is a need for a more cost- and time-effective ALD system.

SUMMARY

In certain embodiments, a system includes a chamber, a support structure disposed in the chamber, and one or more heads. The support structure is configured to support and position a substrate. The one or more heads includes an energy source coupled to a near-field transducer for providing localized energy towards the support structure at select locations within the chamber.

In certain embodiments, a method for depositing materials using a system is disclosed. The system includes a chamber, a support structure, and one or more heads, The method includes positioning a substrate on the support structure; positioning the support structure such that the substrate is a distance from the one or more heads; directing a first precursor into the chamber towards a first target region of the substrate; activating, via at least one of the one or more heads, the first target region to cause the first precursor to react and form a first material layer on the substrate; directing a second precursor into the chamber towards the first target region of the substrate; and activating, via another of the one or more heads, the first target region to cause the second precursor to react and form a second material layer on the first material layer.

In certain embodiments, a device includes a body with openings therethrough, an energy source coupled to the body, and a near-field transducer coupled to the body and optically coupled to the energy source.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
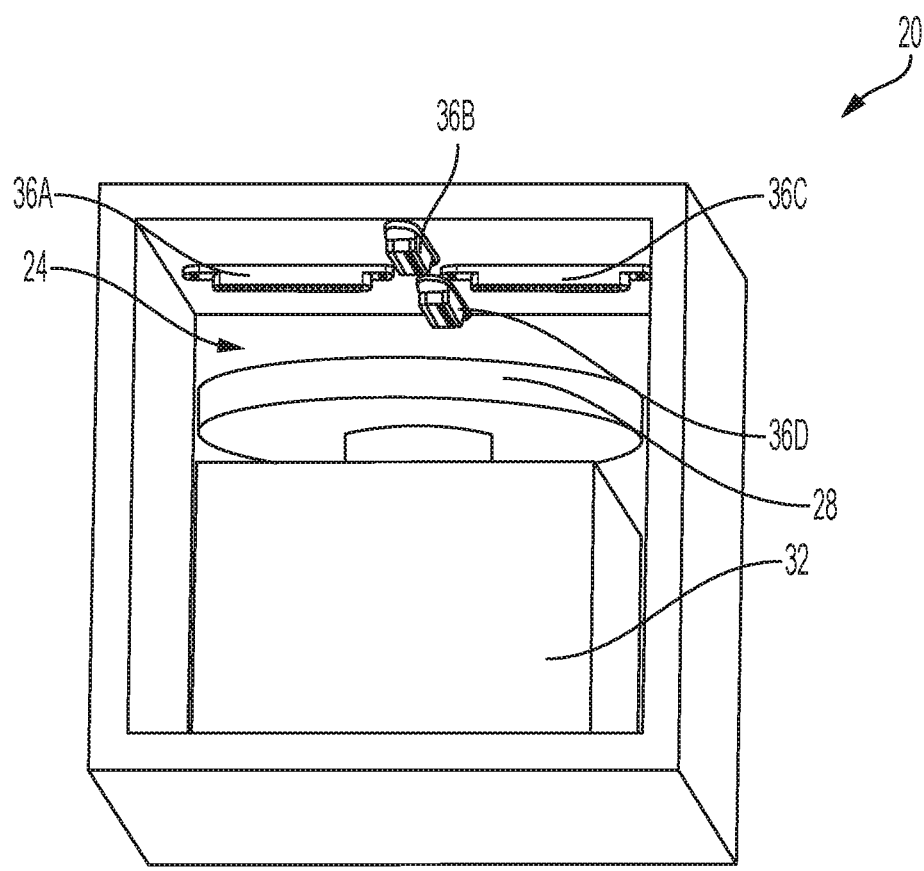
FIG. 1 shows an ALD system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Atomic layer deposition (ALD) is used for depositing atomically-thick layers onto a surface of a substrate. Current approaches for ALD involve sequentially moving various gaseous precursors (sometimes referred to as reactants) in and out of a reactor, the process of which is costly and takes significant time to deposit materials. For example, current approaches require the entire surface to be deposited upon before one precursor is purged from the reactor and another injected into the reactor. ALD is considered to be self-limiting such that deposition is automatically halted (e.g., no longer accumulates on the target surface) when all reactive sites on the target surface are occupied. As a result, each ALD layer is deposited nearly without defects such as point (i.e., zero-dimension), line (i.e., one-dimension), surface (i.e., two-dimension), or volume (i.e., three-dimension) defects. ALD is used most commonly in the semiconductor industry.

In a typical ALD process, two different precursors are repeatedly delivered and purged, in an alternating way, to and from a reaction chamber. As such, the precursors are not simultaneously present in the reactor chamber but instead are inserted in a series of sequential, non-overlapping pulses. The precursors react sequentially with the surface of a material such that a thin film is slowly deposited with repeated exposure to separate precursors. The precursors react with the substrate (or with an underlying deposited material) via half-reactions. During each ALD cycle, a first precursor is delivered into the reaction chamber (e.g., under vacuum) to allow the first precursor to react with a target surface (e.g., the substrate) such that a monolayer of the first precursor is formed. Excess (e.g., non-adsorbed) precursor is removed (e.g., via purging with an inert gas) from the reaction chamber. Then a second precursor is delivered into the reaction chamber to allow the second precursor to react with the monolayer of the first precursor coated onto the target surface. Excess precursor and by-products are next removed from the reaction chamber. This ALD cycle is repeated until the desired film thickness is achieved.

It is desirable to ensure sufficient reaction time to help achieve full adsorption density such that no reactive sites of the substrate are left empty. One approach to help increase adsorption density is to increase the rate of adsorption, such as by increasing the concentration and/or the sticking probability. As an example, increasing the temperature at the reaction site may increase sticking probability for many ALD reactions. Examples of ALD reactions include catalytic ALD of metal oxides (e.g., as high k-dielectric or insulating layers), thermal ALD of metals (e.g., as conductive pathways), ALD of polymers (e.g., for polymer surface functionalization), and ALD of particles (e.g., for protective coatings).

Certain embodiments of the present disclosure involve ALD systems, devices, and methods for providing activation energy to encourage reactions between the precursors. In particular, certain ALD systems, devices, and methods involve techniques for providing directed, localized energy transfer to encourage reactions to occur. Further, certain ALD systems, devices, and methods involve techniques for directed, localized delivery precursors within the chamber.

FIG. 1 shows a simplified depiction of an ALD system 20. The ALD system 20 includes a chamber 24 (e.g., vacuum chamber), a support structure 28 (e.g., a rotating bed, chuck, or table), an actuation assembly 32, and a plurality of devices 36A, 36B, 36C, and 36D, which are hereinafter referred to as heads (e.g., print heads or nozzles). In certain embodiments, the support structure 28 is configured to support a deposition target (e.g., a substrate or a work piece) and to rotate and/or to translate (e.g., linearly) to position the deposition target in an X-Y plane within the chamber. In various embodiments, the actuation assembly 32 is configured to position the support structure 28 (and therefore the deposition target supported by the support structure 28) along a Z-axis within the chamber 24. For example, the actuation assembly 32 can be configured to adjust, via one or more motors (e.g., servo motors), the working distance between the heads 36A-D and the deposition target, such as via positioning the support structure 28 towards or away from the heads 36A-D. In certain embodiments, the actuation assembly 32 rotates the support structure 28 via one or more motors. In other embodiments, the support structure 28 is coupled to a dedicated actuation system.

In some embodiments, the actuation assembly 32 is configured to adjust and/or maintain a predetermined working distance between the heads 36A-D and the deposition target. The predetermined working distance may change for different steps throughout the ALD process (e.g., method 1000 described below) depending on the size of features to be created by the ALD process. In certain embodiments, the actuation assembly 32 ensures that the same predetermined working distance is used to deposit both the first precursor and the second precursor. Ensuring the same predetermined working distance may involve lowering the support structure 28 after deposition of the first precursor to compensate for the layer thickness added by the deposited first precursor. As an example, a predetermined working distance for a 50 nm feature may be about 50 nm. If the first precursor creates a 1-nm-thick layer, the actuation assembly 32 can lower the support structure 28 by 1 nm such that the working distance is 50 nm during deposition of the second precursor. In certain embodiments, the support structure may be moved in the X-direction, Y-direction, and/or Z-direction via activating a servo system which may include one or more motors. In some embodiments, the heads 36A-D themselves are positionable within the chamber 24 and can rotate and/or adjust their relative positions with respect to the deposition target. In various embodiments, the ALD system 20 includes one or more position sensors for determining the X-position, the Y-position, and/or the Z-position. The one or more position sensors may be friction-based, capacitance-based, optical-based, and/or magnet-based.

As illustrated, the heads 36A-D may be disposed substantially radially within the chamber 24. In various embodiments, the heads 36A-D are configured to direct one or more precursors (e.g., gaseous precursors) into the chamber 24 towards a target region (e.g., the deposition target or portions thereof). In some embodiments, heads 36A and 36C are configured to direct a first precursor and heads 36B and 36D are configured to direct a second precursor. Having heads dedicated to injecting one type of precursor (rather than multiple precursors) can help reduce build-up of precursor material on the heads.

Figure 2:
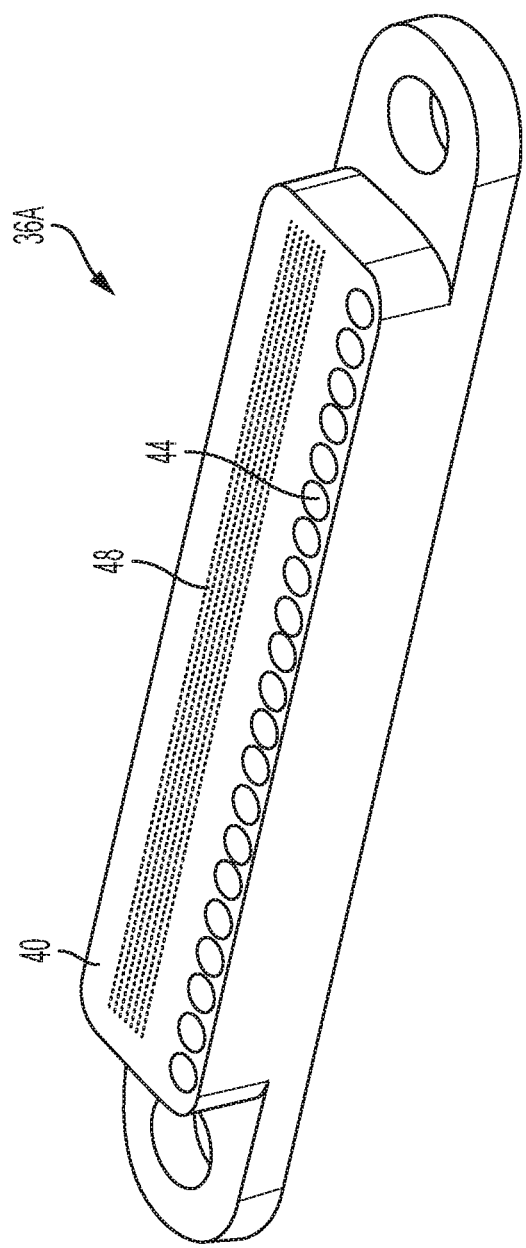
FIG. 2 shows a perspective view of a head, in accordance with certain embodiments of the present disclosure.
Figure 3:
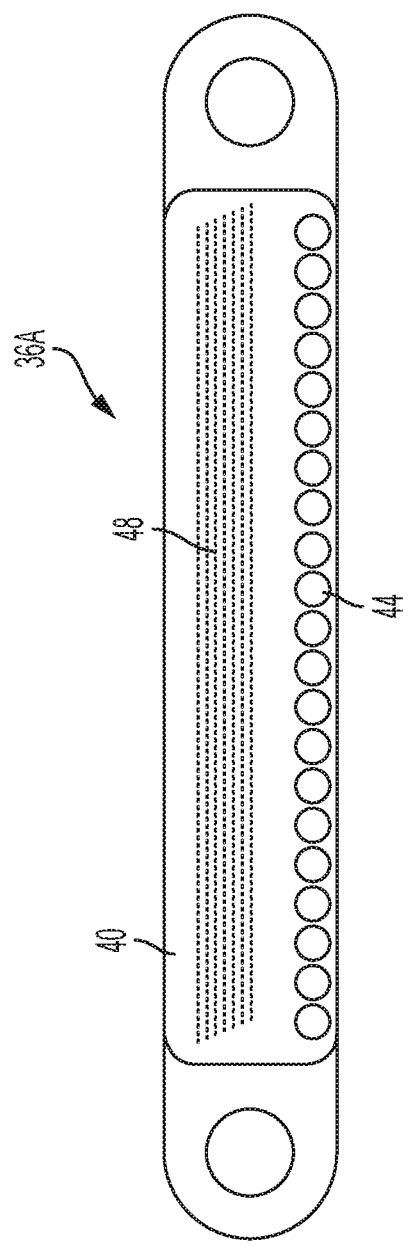
FIG. 3 shows a bottom view of the head of FIG. 2, in accordance with certain embodiments of the present disclosure.

FIGS. 2-3 show a head 36A in a perspective view and a bottom view, respectively. While the head illustrated in FIGS. 2-3 is labeled as the head 36A, it is to be understood that the heads 36A-D may be substantially similar or identical, and thus, the descriptions of the head 36A may be applicable to the other heads 36B-D.

As illustrated, the head 36A includes a body 40 having one or more openings 44 (e.g., gas inlets) and one or more energy sources 48. In various embodiments, the one or more openings 44 are configured to deliver and/or to guide a precursor towards a target region such as the deposition target or parts thereof within the chamber 24. The one or more openings 44 may be arranged substantially linearly and/or side-by-side, such as along a length of the head 36A. In certain embodiments, the one or more energy sources 48 includes one or more lasers (e.g., VCSELs and the like) configured to deliver heat towards the target region to heat the surface of the substrate to encourage reaction of the precursor delivered via the one or more openings 44.

Figure 4:
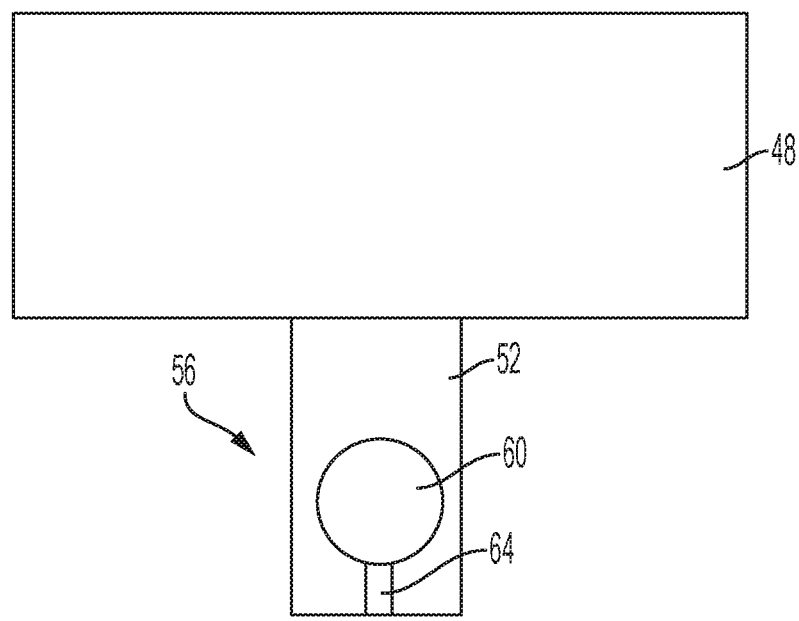
FIG. 4 shows an energy source, waveguide, and near-field transducer, in accordance with certain embodiments of the present disclosure.

In certain embodiments, as shown in FIG. 4, the energy sources 48 are optically coupled to one or more NFTs 56 (e.g., plasmonic NFTs) via a waveguide 52. The NFTs 56 may include a metal disk 60 and a peg 64 below the disk 60. In embodiments, the distal end of the peg 64 is arranged to face the target surface. When light emitted by the energy sources 48 hits the disk 60, the light is converted to an electric surface current. This surface current and the associated electromagnetic fields are known as surface plasmons, which propagate along the surface of the disk 60 into the peg 64, which emits heat at a precise and limited point or target. As such, the NFTs 56 are configured to create a hotspot on a target region of a target surface such that temperature rises at the target region. The heated target region can encourage reaction of the precursor at that particular region. The energy sources 48 and/or NFTs 56 can be individually addressable/activated to create layers in particular patterns. As such, the energy sources 48 and/or NFTs 56 can be used to create features that otherwise would require additional processing steps such as masking, etc.

In certain embodiments, the head 36A does not include an NFT 56 and instead solely uses a laser for providing energy. Such embodiments, may be used for creating lower resolution features. In other embodiments, the ALD system 20 includes some heads 36A-D with one or more NFTs 56 and some devices without NFTs 56. Further, although the heads 36A-D are shown as being used to inject the precursors and provide energy to encourage reaction of the precursors, the injection functionality and the energy functionality can be provided by separate components in the ALD system 20. For example, the heads 36A-D could include the energy sources 48, the waveguides 52, and the NFTs 56 while another component could include openings to inject the precursors into the chamber 24.

According to some embodiments, the NFT 56 may be comprised of a metal that achieves surface plasmonic resonance in response to an applied energy (e.g., light from a laser). In some embodiments, the NFT 56 comprises one or more of aluminum (Al), antimony (Sb), bismuth (Bi), chromium (Cr), cobalt (Co), copper (Cu), erbium (Er), gadolinium (Gd), gallium (Ga), gold (Au), hafnium (Hf), indium (In), iridium (Ir), iron (Fe), manganese (Mn), molybdenum (Mo), nickel (Ni), niobium (Nb), osmium (Os), palladium (Pd), platinum (Pt), rhenium (Re), rhodium (Rh), ruthenium (Ru), scandium (Sc), silicon (Si), silver (Ag), tantalum (Ta), tin (Sn), titanium (Ti), vanadium (V), tungsten (W), ytterbium (Yb), yttrium (Y), zirconium (Zr), or combinations thereof. In certain embodiments, the NFT 56 includes a binary alloy, a ternary, a lanthanide, an actinide, a dispersion, an intermetallic such as a ternary silicide, a nitride, or a carbide, an oxide such as a conducting oxide, and/or a metal doped with oxide, carbide or nitride nanoparticles. Illustrative oxide nanoparticles can include, for example, oxides of yttrium (Y), lanthanum (La), barium (Ba), strontium (Sr), erbium (Er), zirconium (Zr), hafnium (Hf), germanium (Ge), silicon (Si), calcium (Ca), aluminum (Al), magnesium (Mg), titanium (Ti), cerium (Ce), tantalum (Ta), tungsten (W), thorium (Th), or combinations thereof. Illustrative nitride nanoparticles can include, for example, nitrides of zirconium (Zr), titanium (Ti), tantalum (Ta), aluminum (Al), boron (B), niobium (Nb), silicon (Si), indium (In), iron (Fe), copper (Cu), tungsten (W), or combinations thereof. Illustrative carbide nanoparticles can include, for example carbides of silicon (Si), aluminum (Al), boron (B), zirconium (Zr), tungsten (W), titanium (Ti), niobium (Nb), or combinations thereof.

In various embodiments, the NFT 56 comprises materials and/or is shaped to emit wavelengths (e.g., ultraviolet wavelengths) that are better suited for certain precursors. For example, an NFT comprising aluminum (Al), gallium (Ga), rhodium (Rh), indium (In), or iridium (Ir) may operate better in the ultraviolet spectrum for precursors comprising alumina or titania. As another example, an NFT comprising gold (Au) may operate better in the visible and infrared spectrum with precursors comprising ruthenium (Ru), tantalum (Ta), silicon (Si), titanium (Ti), germanium (Ge), platinum (Pt) or nitrides such as TiN and TaN.

In some embodiments, as the substrate is rotated, a first precursor is injected into the chamber 24 via the one or more openings 44 in head 36A. The deposition target (e.g., substrate) is heated by the energy source 48 and/or NFT 56. For example, when the energy source 48 is a laser, the laser is activated to emit light towards the waveguide 52, which directs the emitted light to the NFT 56. The NFT 56 converts the emitted light to localized, focused energy (e.g., heat) that is directed to at least select locations (e.g., regions or portions) of the deposition target. For example, the energy could be directed towards the deposition target in a predetermined pattern to cause the first precursor to react and form a monolayer of a first material in a given pattern. In certain embodiments, the deposition target is activated (e.g., thermally activated, photonically activated) by just a laser and optionally an optically coupled waveguide to cause the first precursor to react.

In certain embodiments, once the first precursor has reacted and formed a monolayer of a first material, the chamber 24 is next purged (e.g., with an inert gas). Next, as the deposition target rotates, a second precursor is passed through openings 44 of another head 36B. The deposition target (e.g., substrate) is activated by the energy source 48 and/or NFT 56 of the head 36B. In some embodiments, the un-reacted precursors and reaction by-products can be continuously or intermittently removed, such as by purging and/or applying vacuum, from the chamber 24 to remove undesired material from the chamber 24. In certain embodiments, an inert gas (e.g., argon) is injected into the chamber 24 to help purge undesired material from the chamber 24.

In certain embodiments (e.g., embodiments involving thermal activation), the ALD system 20 can include a preheater (e.g., a heating unit) configured to supply heat to the deposition target, such as via the support structure 28 to reduce the amount of energy required from the energy sources 48 and/or the NFTs 56. In some embodiments, the ALD system 20 includes an energy monitor configured to monitor the amount of energy delivered to the deposition target from the energy source 48, the measured amount of energy may be used to guide adjustment of one or more parameters of the energy source 48.

Figure 5:
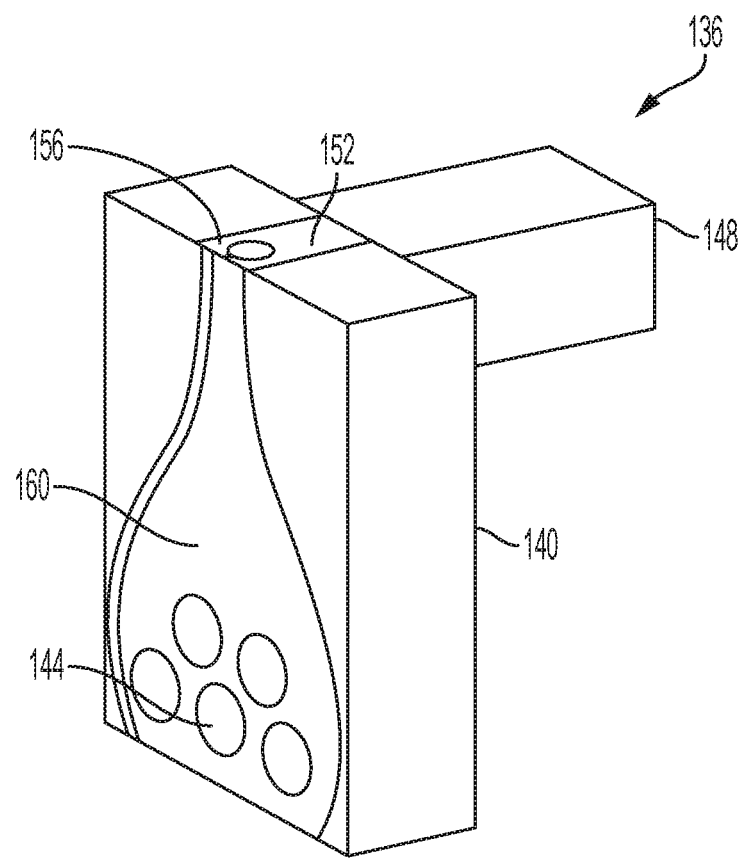
FIG. 5 shows a perspective view of a head, in accordance with certain embodiments of the present disclosure.

FIG. 5 shows an alternative head design, which could be used in the ALD system 20 shown in FIG. 1. The head 136 may be used for ALD systems that feature a support structure that moves in the X-Y direction rather than rotating. In other embodiments, the head 136 itself can move in the X-Y direction rather than, or in addition to, the support structure. The head 136 includes a body 140, an opening 144, an energy source 148 (e.g., laser), a waveguide 152, a NFT 156, and an injection channel 160. As illustrated, the opening 144 is fluidically connected to the injection channel 160. The injection channel 160 can act as an air bearing, and the fly height (e.g., distance to the deposition target) can be controlled via heat, pressure, and/or force of the precursor injected into the chamber. The energy source 148, the waveguide 152, and the NFT 156 may be optically coupled together. In various embodiments, the energy source 148 is configured to emit light into the waveguide 152, the waveguide 152 is configured to direct the light to the NFT 156, and the NFT 156 is configured to convert the light to energy that is directed towards a surface of the substrate. The energy can help activate reaction of a precursor. The NFT 156 can comprise one or more of the materials listed above with respect to the NFT 56 of FIG. 4.

Figure 6:
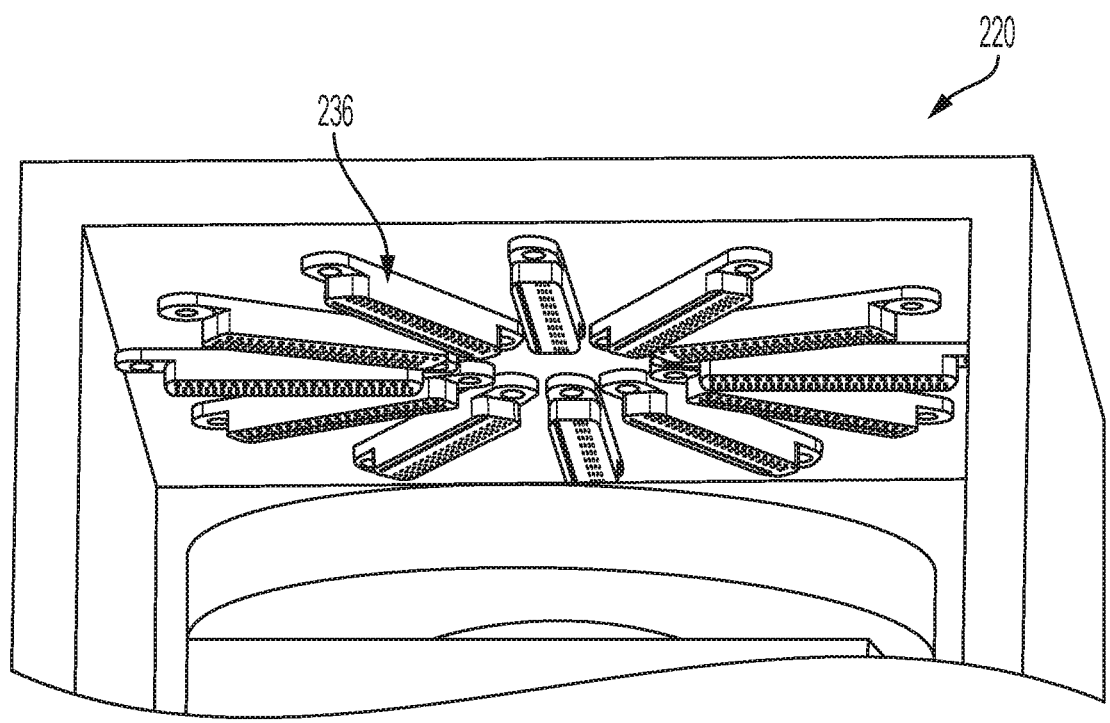
FIG. 6 shows a partial view of an ALD system, in accordance with certain embodiments of the present disclosure.

FIG. 6 shows an ALD system 220 similar to the ALD system 20 shown in FIG. 1. As shown in FIG. 6, ALD systems can include any number of individual heads to deliver the precursors and/or the energy for encouraging reaction of the precursors. As illustrated, ALD system 220 includes twelve heads 236. In certain embodiments, some of the heads 236 are used for delivering a first precursor and some of the heads 236 are used for delivering a second precursor. In certain embodiments, some of the heads 236 are used to deliver a third precursor.

Figure 7:
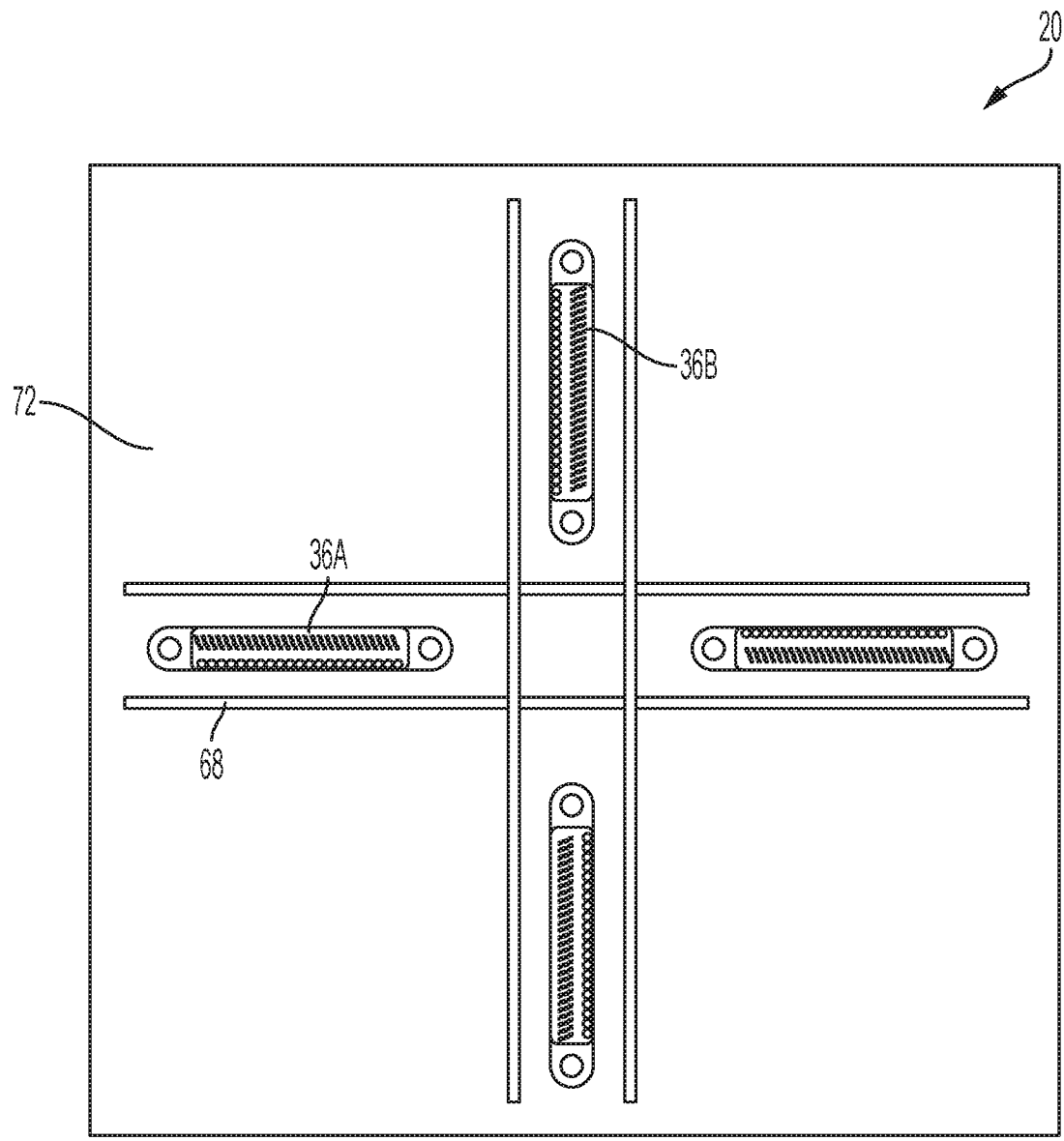
FIG. 7 shows heads and baffles for use in an ALD system, in accordance with certain embodiments of the present disclosure.

FIG. 7 shows features that can be incorporated into an ALD system (e.g., the ALD systems 20, 220) to help direct injection of precursors within a chamber. FIG. 7 shows baffles 68, which may also be referred to as dividers, separators, and the like. The baffles 68 may separate at least one of the heads 36A-D from at least one of the other heads 36A-D. The baffles 68 may be configured to define a plurality of sub-chambers each confining one or more of the heads 36A-D to confine precursors delivered by the heads 36A-D within their respective sub-chamber. In certain embodiments, each of the heads 36A-D may be positioned in between at least two of the baffles 68, which may be substantially parallel to each other. In some embodiments, the baffles 68 may be disposed on a top 72 of the chamber 24 and extend downward (e.g., towards the support structure). The use of baffles 68 may help accelerate the deposition process by requiring less gas (e.g., concentrating the precursor) to be delivered and less time for purging and/or vacuuming. The use of baffles 68 may further accelerate the deposition process by allowing multiple precursors to be in the chamber 24 simultaneously, such as having a first precursor in a first sub-chamber and a second precursor in a second sub-chamber simultaneously.

Figure 8:
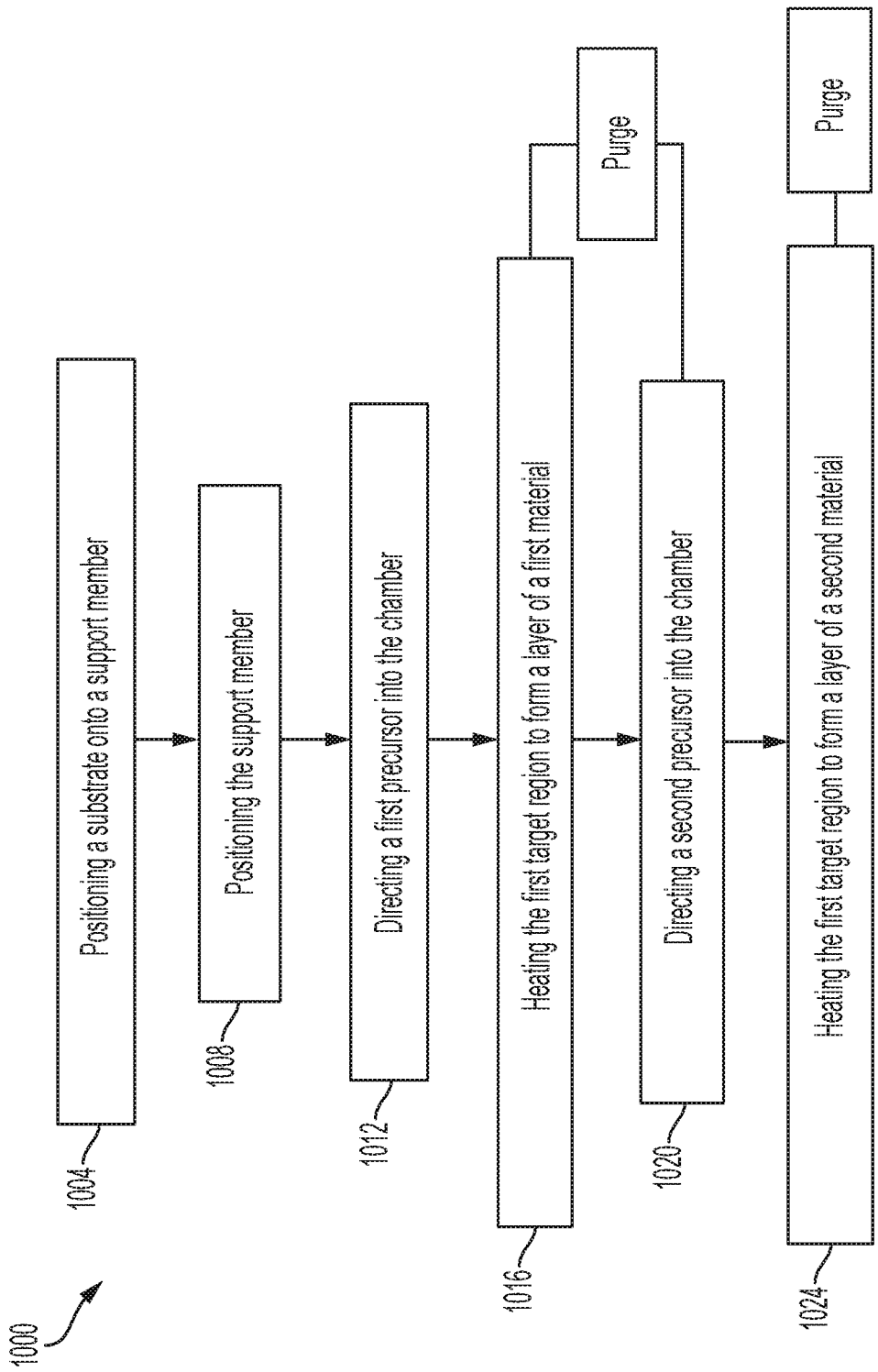
FIG. 8 depicts an ALD method, in accordance with certain embodiments of the present disclosure.

FIG. 8 depicts an illustrative method 1000 for an ALD process. The method 1000 includes positioning a substrate onto the support structure (block 1004), positioning the support structure to be near the one or more heads such that a top surface of the substrate is at a predetermined working distance from the one or more heads (block 1008), directing a first precursor into the chamber towards a first target region of the substrate via a first head of the one or more heads (block 1012), activating the first target region to cause the first precursor to react and form a first material layer on the substrate (block 1016), directing a second precursor into the chamber towards the first target region of the substrate via a second head of the one or more heads (block 1020), and activating the first target region to cause the second precursor to react and form a second material layer on the first material layer (block 1024). The first target region includes only select regions of the substrate (e.g., the deposition target).

In various embodiments, the process 1004 of positioning a substrate (e.g., the deposition target) onto the support structure (e.g., support structure 28) includes securing the substrate onto the support structure. In certain embodiments, positioning the substrate includes exposing select regions of the substrate for material deposition. In some embodiments, the process 1008 of positioning the support structure to be near the one or more heads such that a top surface of the substrate is at a predetermined working distance from the one or more heads (e.g., the heads 36A-D) includes translating and/or rotating the support structure to adjust the relative position between the select regions and the one or more heads 36A-D. For example, translating and/or rotating the support structure 28 includes activating a servo system, which may include activating a Z-axis actuation assembly. In some embodiments, positioning the support structure includes continuously or periodically (e.g., after each layer of material deposition) adjusting a working distance to maintain the predetermined working distance between the top surface of the substrate and the one or more heads 36A-D.

In certain embodiments, the process 1012 of directing a first precursor into the chamber towards a first target region of the substrate via a first head (e.g., head 36A) of the one or more heads includes emitting the first precursor from one or more emission openings (e.g., one or more emission openings 44) of the first head. In some embodiments, the process 1016 of activating the first target region to cause the first precursor to react and form a first material layer on the substrate includes activating an energy source (e.g., energy source 48) to deliver energy (e.g., by emitting light) into a waveguide (e.g., waveguide 52), directing the energy to an NFT (e.g., NFT 56) via the waveguide, and converting the energy from the energy source into an activation energy (e.g., heat) via the NFT.

In certain embodiments, the process 1020 of directing a second precursor into the chamber towards the first target region of the substrate via a second head (e.g., head 36B) of the one or more heads includes emitting the first precursor from one or more emission openings of the second head. In some embodiments, the process 1024 of activating the first target region to cause the second precursor to react and form a second material layer on the first material layer includes activating an energy source to deliver energy into a waveguide, directing the energy to an NFT via the waveguide, and converting the energy from the energy source into activation energy via the NFT. In various embodiments, the method 1000 includes purging the chamber and/or adjusting the working distance, following the formation of the first material layer and/or after the formation of the second material layer such that excess precursors and reaction by-products are removed.

In certain embodiments, the method 1000 includes repeating the process of 1012, the process of 1016, the process of 1020, the process of 1024, and optionally one or more purging processes. The repeating of the processes may continue until a target deposition thickness is reached.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system comprising:
a chamber;
a support structure disposed in the chamber and configured to support and position a substrate by rotation around a rotation axis; and
heads each including a respective energy source coupled to a respective near-field transducer for providing localized energy towards the support structure at select locations within the chamber, wherein each head includes multiple gas inlet openings.

2. The system of claim 1, wherein the energy source comprises a laser.

3. The system of claim 1, further comprising: waveguides each optically coupled between one of the energy sources and one of the near-field transducers.

4. The system of claim 1, wherein the heads comprises an array of near-field transducers.

5. The system of claim 1, wherein the chamber further includes an actuation assembly for positioning the support structure towards or away from the one or more heads.

6. The system of claim 1, wherein the heads includes a first group of heads and a second group of heads, wherein the first group of heads is configured to deliver a first gas, wherein the second group of heads is configured to deliver a second gas.

7. The system of claim 6, wherein the heads includes a third group of heads configured to deliver a third gas.

8. The system of claim 1, further comprising a heating unit configured to heat the support structure.

9. The system of claim 1, wherein the heads are positionable within the chamber.

10. The system of claim 1, further comprising baffles positioned within the chamber to direct gas delivered by the heads to a target region.

11. The system of claim 1, wherein the support structure is controlled along the rotation axis to be lowered after deposition of a first precursor to maintain a predetermined working distance between a top surface of the substrate and the heads for deposition of a second precursor.

12. The system of claim 1, wherein each near-field transducer includes a peg and a disk.

13. The system of claim 12, wherein the disk comprises metal.

14. The system of claim 1, wherein each energy source and each near-field transducer is individually addressable.

15. The system of claim 1, wherein gas inlet openings are arranged along a row on each head.

16. The system of claim 1, wherein the heads are secured to a top of the chamber.

17. The system of claim 1, wherein the near-field transducers comprise gold.

18. A device comprising:
a head comprising a body with gas inlet openings therethrough;
lasers coupled to the body;
near-field transducers coupled to the body, each near-field transducer is optically coupled one of the lasers; and
waveguides coupled to the body, each waveguide is optically coupled between one of the lasers and one of the near-field transducers and not positioned within the gas inlet openings.

19. The device of claim 18, wherein the body forms an injection channel on outer surface.

20. The device of claim 19, wherein the injection channel is fluidically coupled to the gas inlet openings.

* * * * *